United States Patent
Kobayashi et al.

(10) Patent No.: US 6,899,469 B2
(45) Date of Patent: May 31, 2005

(54) BIDIRECTIONAL OPTICAL TRANSMISSION DEVICE

(75) Inventors: Kazuhiro Kobayashi, Yamanashi-ken (JP); Yuichiro Tanda, Yamanashi-ken (JP); Yasuaki Kayanuma, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 150 days.

(21) Appl. No.: 10/245,384

(22) Filed: Sep. 18, 2002

(65) Prior Publication Data

US 2003/0059178 A1 Mar. 27, 2003

(30) Foreign Application Priority Data

Sep. 21, 2001 (JP) .......................................... 2001-290270

(51) Int. Cl.⁷ ................................................. G02B 6/36
(52) U.S. Cl. .............................. 385/92; 385/88; 385/33
(58) Field of Search ............................ 385/92, 88, 33, 385/38, 93

(56) References Cited

U.S. PATENT DOCUMENTS

| | | | |
|---|---|---|---|
| 5,181,264 A | * | 1/1993 | Chiaretti et al. ............... 385/33 |
| 5,272,555 A | | 12/1993 | Suzuki |
| 5,566,265 A | * | 10/1996 | Spaeth et al. .................. 385/93 |
| 5,838,859 A | * | 11/1998 | Butrie et al. ................... 385/92 |
| 5,841,562 A | * | 11/1998 | Rangwala et al. .......... 398/139 |
| 6,205,274 B1 | * | 3/2001 | Zhou ............................. 385/38 |
| 6,454,467 B1 | * | 9/2002 | Ishihara et al. ................ 385/88 |
| 6,501,876 B1 | | 12/2002 | Okada |
| 6,694,074 B2 | * | 2/2004 | Schunk ......................... 385/33 |

FOREIGN PATENT DOCUMENTS

JP  2000 162455  6/2000

* cited by examiner

Primary Examiner—Daniel Stcyr
Assistant Examiner—Daniel A. Hess
(74) Attorney, Agent, or Firm—Dennison, Schultz, Dougherty & MacDonald

(57) ABSTRACT

A bidirectional optical transmission device has a housing having a guide portion in which an end of a single optical fiber is to be inserted. A light-receiving device and a light-emitting device are provided in the housing. Light path restricting members are provided in the light-receiving device so as to restrict light beams entering the light-receiving device.

4 Claims, 6 Drawing Sheets

BIDIRECTIONAL OPTICAL TRANSMISSION DEVICE

BACKGROUND OF THE INVENTION

The present invention relates to a bidirectional optical transmission device which is applied to an optical transceiver and optical mini-jack, and which is particularly suitable for short-distance transmission.

An optical fiber has advantages such as being small in diameter, light in weight, that is the specific gravity of glass is about one fourth of that of copper, superior in flexibility, that is, the radius of curvature is less then several centimeters, having high resistances against electromagnetic induction and crosstalk, small loss of about 1 dB/km for example, being capable of broad-band transmission, and having small problem with regard to resources. Thus optical fiber cable transmission system is widely used not only in public transmission field such as wide area network (WAN), but also in transmission system called local area network (LAN), and data bus, data link and various measurement and control systems.

Moreover, in a personal area network (PAN), there has been used an optical transmission module having a single optical fiber cable, the diameter of which is about 1 mm, connected to a light-emitting device and a light receiving device provided in a housing. The optical transmission module is adapted for optical transceiver for unidirectional transmission. Moreover, two sets of the unilateral optical transmission modules are assembled to form a double-core bidirectional optical transmission module. However, there has not been proposed a bidirectional optical transmission device having a single core which can be adapted to a compact bidirectional optical transmission module.

Figure 6:
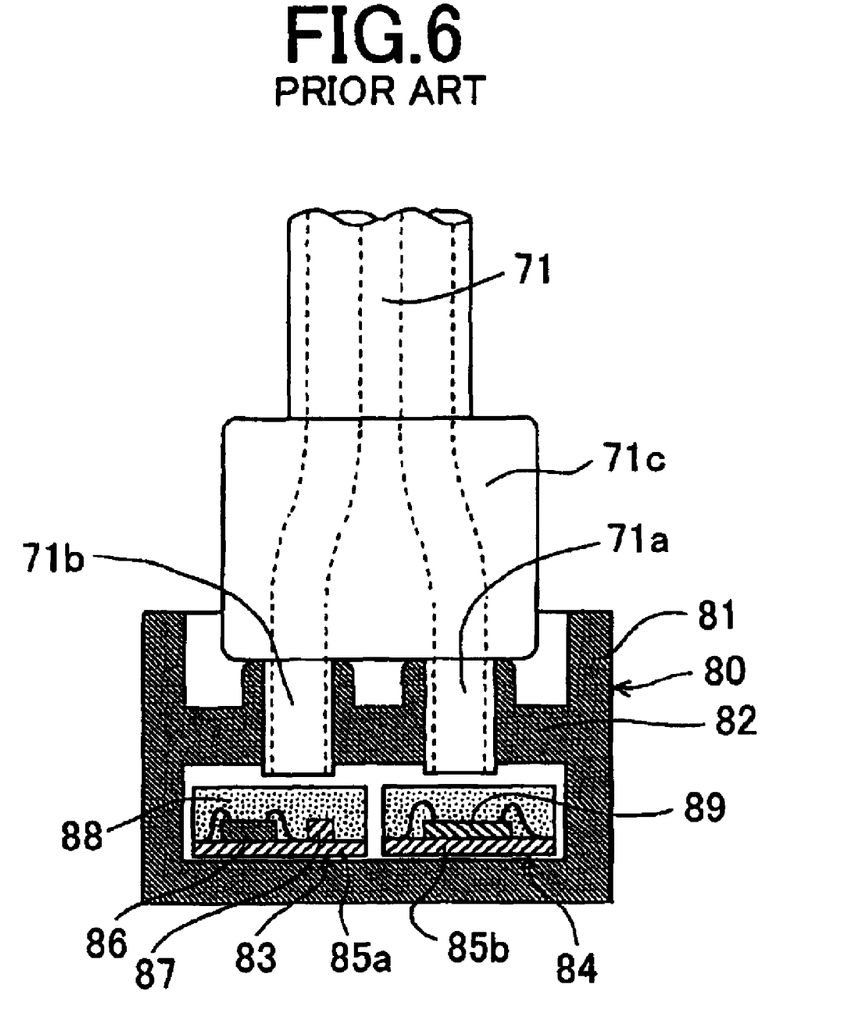
FIG. 6 is a sectional view of a conventional double-core bidirectional optical transmission module.

An example of the conventional double-core bidirectional optical transmission module is described hereinafter with reference to FIG. 6 showing a sectional view thereof.

Referring to FIG. 6, a double-core bidirectional optical transmission module (jack) 80 comprises a housing 81 having a horizontal partition 82, thereby dividing the housing 81 into a lower portion and an upper portion. In the lower portion, there is provided a light-emitting device 83 and a light-receiving device 84.

The light-emitting device 83 comprises a substrate 85a mounted on the bottom of the housing 81, an IC 86 mounted on the substrate 85a for converting an electric signal of a logic level into a light-emitting element driving signal, and a light-emitting element 87 mounted on the substrate 85a and comprising an LED for converting the driving signal to an optical signal. The IC 86 and the light-emitting element 87 are sealed by a transparent resin 88.

The light-receiving device 84 comprises a substrate 85b mounted on the bottom of the housing 81 and light-receiving IC 89 mounted on the substrate 85b, integrally incorporating a photodiode for converting an optical signal into an electric signal, and an IC for amplifying the electric signal to a logic level. The light-receiving IC 89 is also sealed by the transparent resin 88.

The substrates 85a and 85b are connected to terminals (not shown) formed on the outer wall of the housing 81 so as to be connected to external devices.

For the bidirectional optical transmission module 80, there is provided a bidirectional optical transmission double-core fiber cable 71. The fiber cable 71 comprises an optical fiber 71a for receiving light, an optical fiber 71b for emitting light, and a plug 71c for binding the optical fibers 71a and 71b together. The plug 71c is inserted in the housing 81, and each of the optical fibers 71a and 71b is inserted in an opening formed in the partition 82 so as to oppose an end thereof against the light-receiving device 84 or the light-emitting device 83.

In operation, an optical signal fed through the optical fiber 71a is applied to the light-receiving IC 89 through the transparent resin 88, whereby the signal is converted into an electric signal. On the other hand, electric signal fed to the light-emitting element 87 is converted into an optical signal and enters the optical fiber 71b through the transparent resin 88 so as to be externally transmitted.

However, the conventional bidirectional optical transmission module requires the optical fiber cable having two cores. Moreover, it is necessary to take precautions when assembling the optical fiber cable and the optical transmission module so as not to confuse the input and the output thereof. In addition, the double-core optical fiber cable is more rigid than a single-core optical fiber cable and therefore less flexible. Furthermore, the conventional bidirectional optical transmission module has separate light-emitting device and light-receiving device so that the size of the module cannot be rendered small.

SUMMARY OF THE INVENTION

An object of the present invention is to provide a compact bidirectional optical transmission device having a single-core optical fiber cable, and where a light-emitting element and a light-receiving element are packaged in one while sufficiently separating the incoming optical signal from the outgoing optical signal.

According to the present invention, there is provided a bidirectional optical transmission device comprising a housing having a guide portion in which an end of a single optical fiber is to be inserted, a light-receiving device provided in the housing, a light-emitting device provided in the housing, adjacent to the light-receiving device, light path restricting members provided in at least one of the light-receiving device and light-emitting device so as to restrict light beams entering the light-receiving device.

A light shielding baffle is provided between the light-receiving device and the light-emitting device so as to prevent light from entering the light-receiving device.

The light path restricting members are provided in the light-receiving device in parallel with incident light beams.

In another aspect of the present invention, the light path restricting members are provided in the light-receiving device at an angle with the incident light beams.

The light-receiving device and the light-emitting device are sealed by a transparent seal.

These and other objects and features of the present invention will become more apparent from the following detailed description with reference to the accompanying drawings.

DETAILED DESCRIPTION OF THE PREFERRED EMBODIMENTS

Figure 1:
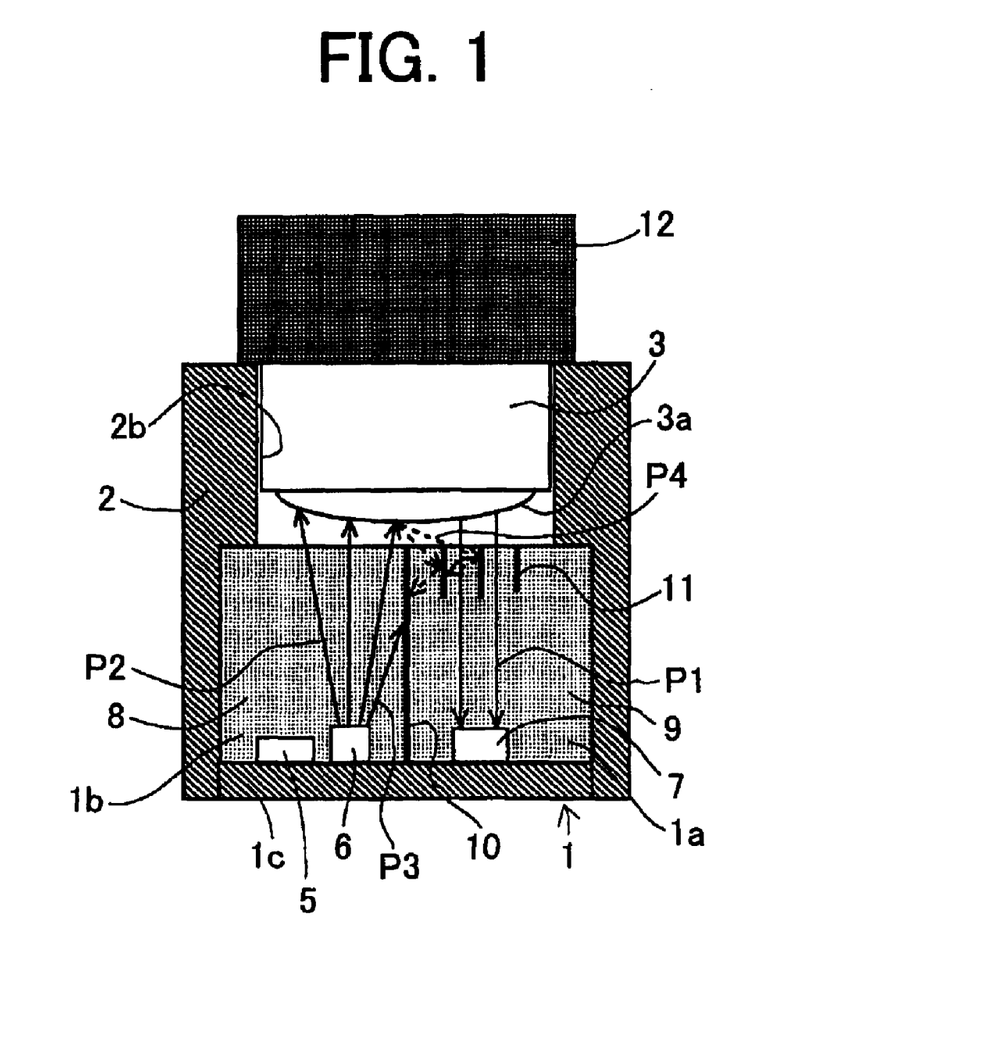
FIG. 1 is a sectional view of a bidirectional optical transmission device according to the present invention.

Referring to FIG. 1, a bidirectional optical transmission device 1 of the present invention has a cylindrical housing 2. The bidirectional optical transmission device 1 comprises a circuit substrate 1c made of a ceramic or a glass epoxy resin, formed at a bottom of the housing 2, light-receiving device 1a and light-emitting device 1b, both of which are adjacently disposed in the housing 2 and mounted on the circuit substrate 1c. The circuit substrate 1c is provided with terminals (not shown) for connecting the device 1 with an external device.

The light-emitting device 1b comprises an IC 5 mounted on the circuit substrate 1c and provided for converting an electric signal of a logic level into a light-emitting element driving signal, and a light-emitting element 6 mounted on the circuit substrate 1c and comprising an LED for converting the driving signal into an optical signal.

The light-receiving device 1a comprises a light-receiving IC 7 mounted on the circuit substrate 1c and integrally incorporating a photodiode for converting an optical signal into an electric signal, and an IC for amplifying the electric signal to a logic level.

The active surfaces of the light-receiving device 1a and the light-emitting device 1b are sealed by seals 8 and 9, respectively, made of transparent resin capable of transmitting light.

A light shielding baffle 10 is provided between the transparent resin seals 8 and 9. Furthermore, a plurality of light path restricting members 11, each of which is formed into a film, are formed on the underside of the upper surface of the seal 9 at a predetermined interval in parallel with the incident light beams.

An optical fiber 3 has a diameter of 1 mm, and consists of a single core, the diameter of which is 980 μm, and a clad, the thickness of which is 20 μm. The optical fiber 3 is positioned in a guide portion 2b of the housing 2 by a connector 12 secured to the housing 2, so that an end surface 3a of the optical fiber 3 opposes the active surfaces of the light-receiving device 1a and the light-emitting device 1b, that is the light-receiving surface of the light-receiving IC 7 and the light-emitting surface of the light-emitting element 6.

The operation of the bidirectional optical transmission device 1 is described hereinafter. An optical signal fed through the optical fiber 3 is applied to the light-receiving device 1a as an incident light P1. The light passes through the seal 9 and is applied to the light-receiving IC 7 so as to be converted into an electric signal.

On the other hand, an optical signal dependent on a driving signal from the IC 5 is emitted from the light-emitting element 6 as an emission light P2. The emission light passes through the seal 8 and is applied to the optical fiber 3 so as to be externally transmitted.

When a single optical fiber 3 is used bidirectionally, and the light-receiving device 1a and the light-emitting device 1b are disposed close to each other as in the present invention, there occurs a problem that a part of the emission light P2 enters the light-receiving IC 7, thereby causing the signal to noise ratio to deteriorate. More particularly, the light which causes noises is a diffused light P3 and reflected light P4 which is the light reflected by the end surface 3a of the optical fiber 3.

In the present invention, the diffused light P3 is blocked by the light shielding baffle 10. The reflected light P4 strikes the light path restricting member 11 so that a portion of the reflected light is absorbed by the restricting member, while the other portion is reflected. The reflected other portion is further absorbed by the resin of the seal 9 by refractive absorption or absorbed by the light path restricting members 11 and hence perishes. Accordingly, the light is rarely applied to the light-receiving IC 7.

Namely, due to the light shielding baffle 10 and the light path restricting members 11, the incident light P1 which is vertically emitted from the optical fiber 3 is applied to the light-receiving IC 7, but the diffused light P3, the reflected light P4 and other external light are not applied to the light-receiving IC 7. Thus the outgoing light from the light-emitting element 6 is sufficiently separated from the incoming light.

Figure 2A:
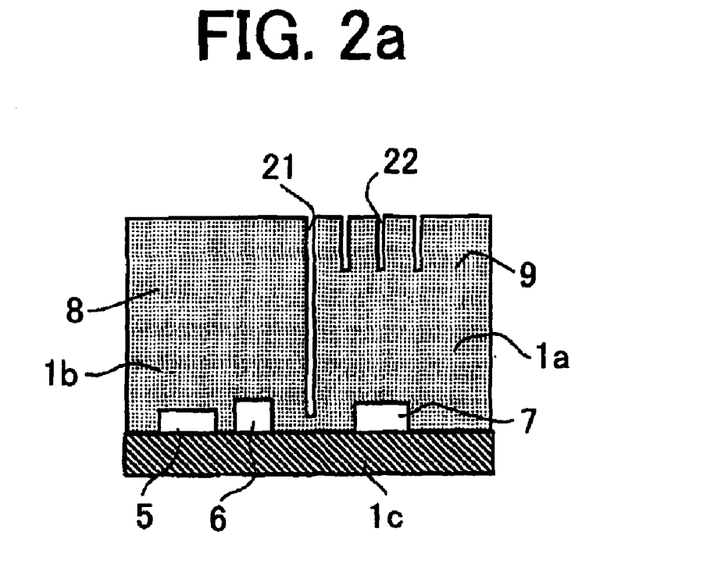
FIGS. 2a and 2b are sectional views explaining the manufacturing method of the bidirectional optical transmission device of FIG. 1.
Figure 2B:
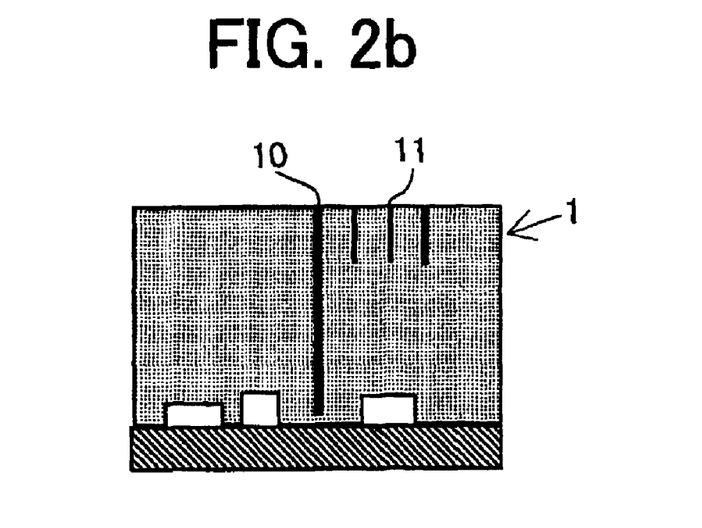

FIGS. 2a and 2b show the manufacturing method of the bidirectional optical transmission device 1. FIG. 2a is a sectional view of the device under production and FIG. 2b is a sectional view of the completed device.

Referring to FIG. 2a, the IC 5, light-emitting element 6 and the light-receiving IC 7 are mounted on a wiring pattern formed on the circuit substrate 1c. Transparent resin is molded on the devices so as to form seals 8 and 9. A groove 21 for forming the light shielding baffle 10 and a plurality of grooves 22 for forming the light path restricting members 11 are formed in the transparent resin by lancing.

A light absorbing material or a light shielding material is embedded in each of the grooves 21 and 22 as shown in FIG. 2b to form the light shielding baffle 10 and the light path restricting members 11, thereby completing the bidirectional optical transmission device 1. The light absorbing material and the light shielding material may be a black resin injected into the grooves, or a metal plate dyed in black embedded in the grooves. By providing the light shielding baffle 10, the light-receiving device 1a and the light-emitting device 1b can be separately formed in the bidirectional optical transmission device 1.

Figure 3A:
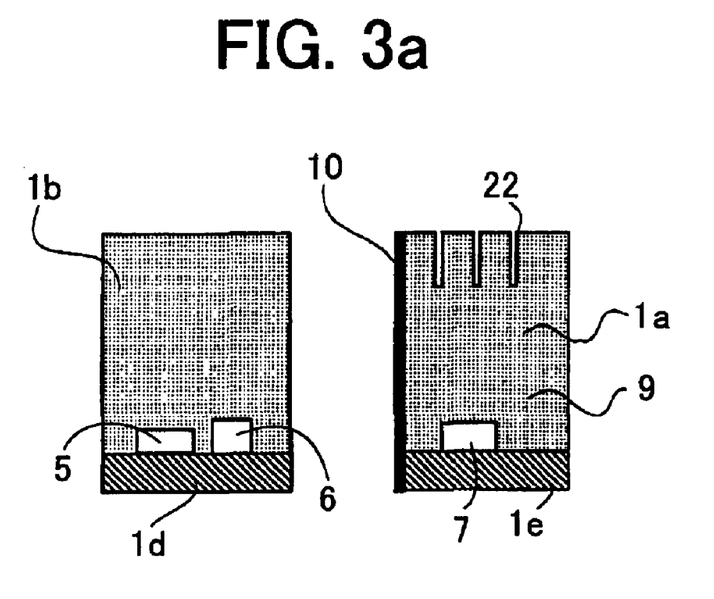
FIGS. 3a and 3b are sectional views explaining another manufacturing method of the bidirectional optical transmission device.
Figure 3B:
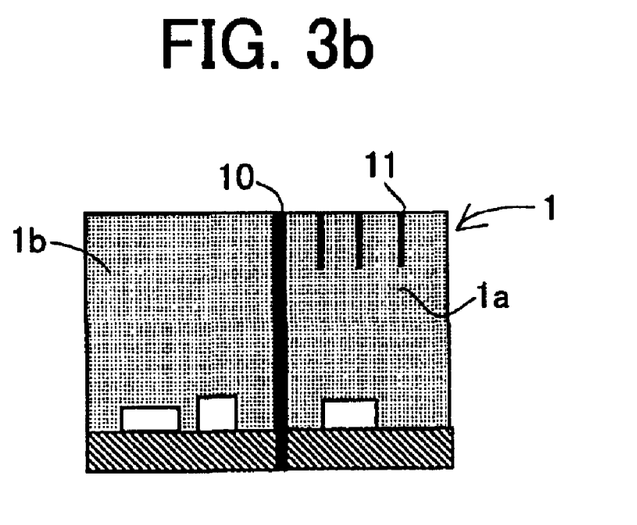

FIGS. 3a and 3b show another method for manufacturing the bidirectional optical transmission device 1. FIG. 3a is a sectional view of the device under production and FIG. 3b is a sectional view of the completed device.

The circuit substrate 1c is divided into two boards 1d and 1e in the present method. On the wire pattern of the circuit substrate 1d, there are mounted the IC 5 and the light-emitting element 6, and on the wire pattern of the other circuit substrate 1e, there is mounted the light-receiving IC 7. Transparent resin is molded on each of the circuit substrates 1d and 1e, thereby forming the seals 8 and 9, respectively. Hence the light-receiving device 1a and the light-emitting device 1b are separately formed.

The light absorbing material or light shielding material is attached on the abutting plane of the light-receiving device 1a, thereby forming the light shielding baffle 10. Grooves 22 are formed in the seal 9 by lancing.

As shown in FIG. 3b, the light absorbing material or light shielding material is embedded in the slits 22 to form the light path restricting members 11. The light-receiving device 1a and the light-emitting device 1b are attached to each other, interposing the light shielding baffle 10 so that the bidirectional optical transmission device 1 is completed.

The light shielding baffle 10 may be formed on either of the light-receiving device 1a and the light-emitting device 1b. However, when the light shielding baffle 10 is formed on the light-receiving device 1a as shown in FIG. 3a, black resin may be injected in the groove 22 at the same time.

The light shielding baffle 10 need not be limited to black resin but may be formed by metal plated film. The side opposite the attaching side of each of the light-receiving device 1a and the light-emitting device 1b may further be simultaneously treated in the same manner, thereby forming a light shield against external light.

Figure 4:
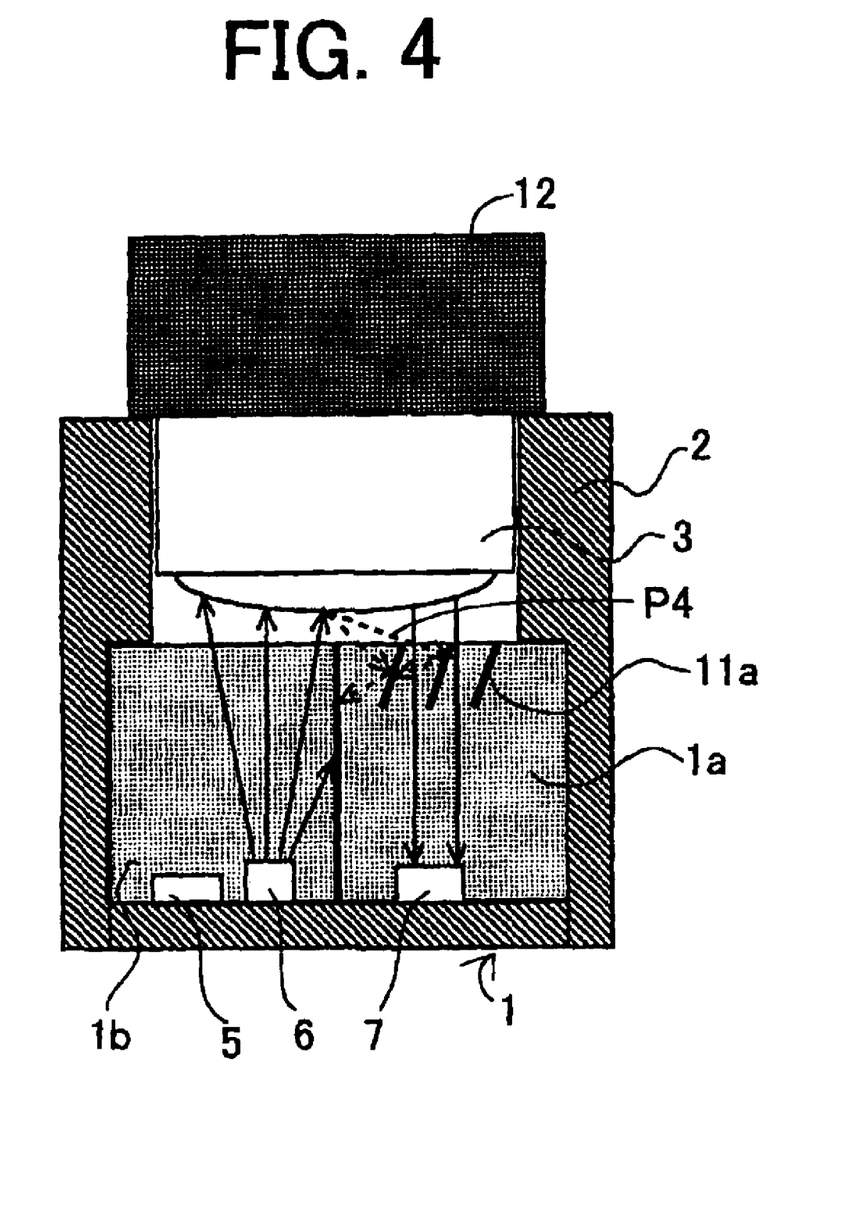
FIG. 4 is a sectional view of a second embodiment of the bidirectional optical transmission device of the present invention.

Referring to FIG. 4, the bidirectional optical transmission device 1 of the second embodiment has a plurality of light path restricting members 11a provided in the seal 9, which are inclined in a predetermined angle with respect to the normal line on the light receiving surface of the light-receiving IC 7. This prevents the light emitted from the light-emitting element 6 of the light-emitting device 1b, that is the reflected light P4, from entering the light-receiving device 1a more effectively. Thus, superior light shielding effect is obtained. Other construction and operations are the same as in the first embodiment.

Figure 5:
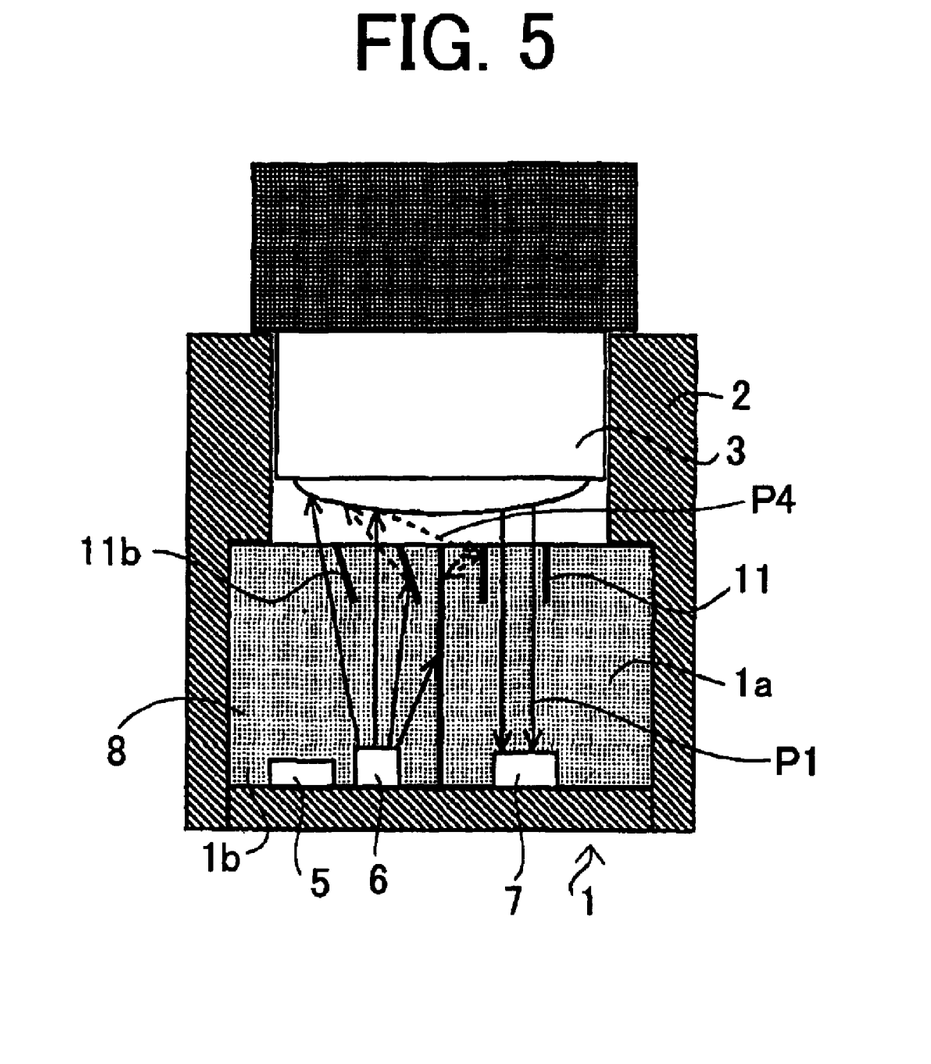
FIG. 5 is a sectional view of a third embodiment of the bidirectional optical transmission device of the present invention.

In the third embodiment of the bidirectional optical transmission device 1 shown in FIG. 5, in addition to the light path restricting members 11 of the optical transmission device 1 of FIG. 1, a plurality of light path restricting members 11b are provided on the underside of the upper surface of the seal 8 in the light-emitting device 1b.

In the present embodiment, the light path restricting members 11b are inclined toward the light-receiving device 1a. Hence not only is the quantity of the reflected light P4 which enter the light-receiving device 1a decreased, the incident angle thereof is increased so as to decrease the influence thereof. Since the light path restricting members 11 provided in the light-receiving device 1a are in parallel to the normal on the light-receiving surface of the light-receiving IC 7, the quantity of the incident light P1 is not decreased.

In accordance with the present invention, there is provided a bidirectional optical transmission device having a light-emitting device and a light-receiving device where light path restricting members are provided at least in one of the devices so as to restrict the direction of light. The incoming light is accordingly sufficiently separated from the outgoing light. The bidirectional optical transmission device uses the optical fiber having only one core so that the size of the device can be decreased.

While the invention has been described in conjunction with preferred specific embodiment thereof, it will be understood that this description is intended to illustrate and not limit the scope of the invention, which is defined by the following claims.

What is claimed is:

1. A bidirectional optical transmission device comprising:
   a housing having a guide portion including means for inserting an end of a single optical fiber;
   a substrate disposed in a bottom portion of the housing;
   a light shielding baffle plate mounted on the substrate to divide the a lower space of the housing into two accommodating spaces;
   a light-receiving device mounted on the substrate in one of the accommodating spaces;
   a light-emitting device mounted on the substrate in the other of the accommodating spaces; and
   light path restricting members provided in at least one of the accommodating spaces so as to absorb light beams emitted from the light-emitting device for preventing the light beam from entering the light-receiving device.

2. The device according to claim 1 wherein the light path restricting members are provided in the light-receiving device in parallel with incident light beams.

3. The device according to claim 1 wherein the light path restricting members are provided in the light-receiving device at an angle with the incident light beams.

4. The device according to claim 1 further comprising a transparent seal sealing the light-receiving device and the light-emitting device.

* * * * *

UNITED STATES PATENT AND TRADEMARK OFFICE
CERTIFICATE OF CORRECTION

PATENT NO. : 6,899,469 B2
DATED : May 31, 2005
INVENTOR(S) : Kazuhiro Kobayashi et al.

It is certified that error appears in the above-identified patent and that said Letters Patent is hereby corrected as shown below:

Column 6,
Line 21, delete "the".

Signed and Sealed this

Eighteenth Day of October, 2005

JON W. DUDAS
*Director of the United States Patent and Trademark Office*